United States Patent
Fujikawa et al.

[11] Patent Number: 5,898,727
[45] Date of Patent: *Apr. 27, 1999

[54] HIGH-TEMPERATURE HIGH-PRESSURE GAS PROCESSING APPARATUS

[75] Inventors: Takao Fujikawa, Takasago; Takahiko Ishii, Osaka; Tomomitsu Nakai; Yoshihiko Sakashita, both of Takasago, all of Japan

[73] Assignees: Kabushiki Kaisha Kobe Seiko Sho, Kobe; Nihon Shinku Gijutsu Kabushiki Kaisha, Chigasaki, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/845,822

[22] Filed: Apr. 28, 1997

[30] Foreign Application Priority Data

Apr. 26, 1996 [JP] Japan .................................. 8-107781

[51] Int. Cl.$^6$ ..................................................... F27D 7/06
[52] U.S. Cl. ........................... 373/110; 219/403; 427/331; 100/317
[58] Field of Search ..................... 373/109, 110, 373/112, 113, 115, 122, 126, 128–130, 137; 427/331; 219/385–400, 402–403; 100/317

[56] References Cited

U.S. PATENT DOCUMENTS 5,518,771  5/1996  Jeffryes, et al. ........................ 427/331

*Primary Examiner*—Tu Ba Hoang
*Attorney, Agent, or Firm*—Oblon, Spivak, McClelland, Maier & Neustadt, P.C.

[57] ABSTRACT

The present invention provides a processing apparatus for eliminating pores in via holes of a silicon semiconductor. The apparatus includes a high-pressure vessel divided into at least two vessel component members in the axial direction thereof, at least one of which has a cooling unit, a frame for holding a load acting in the axial direction of the high-pressure vessel in processing a workpiece to be processed in the high-pressure vessel, an actuator for moving the vessel component members of the high-pressure vessel in the axial direction thereof so as to load and unload the workpiece, a sealing unit fitted to a portion for loading and unloading the workpiece, which is formed when the vessel component members are moved in the axial direction of the vessel, and a retractable cotter unit for transmitting a load acting in the axial direction of the high-pressure vessel to the frame.

15 Claims, 4 Drawing Sheets

HIGH-TEMPERATURE HIGH-PRESSURE GAS PROCESSING APPARATUS

BACKGROUND OF THE INVENTION

1. Field of the Invention

The present invention relates to an apparatus for processing a thin plate-shaped product in a gas atmosphere of high temperature and high pressure, and particular to a high-temperature high-pressure gas processing apparatus which enables loading and unloading of a workpiece to be processed within a short time in order to process a product in a short cycle. In recent years, the technique of crushing pores formed in via holes below an Al interconnecting film of a silicon semiconductor by using a high pressure gas at high temperature has attracted attention with demand for formation of fine interconnection. The apparatus of the present invention is particularly used for such processing.

2. Description of the Related Art

As a method of processing various materials under a gas atmosphere of high temperature and high pressure, hot isostatic pressing method (HIP method) is well known. This HIP method is industrially used for restoring pore defects in a metal casing, removing residual pores in a powder sintered product, sintering a powder material with a high density, and diffusion-bonding metals and ceramics. The HIP method can also be used for combination of the above-described purposes. For example, it has been proposed that after a film is formed on a surface of a metallic member by known evaporation, HIP processing is performed for eliminating void portions below the film and, at the same time, diffusion bonding the film to increase adhesive strength (Japanese Patent Laid-Open Nos. 54-33232 and 59-50177). This has been experimentally examined. The apparatus used in the HIP method is known as a hot isostatic pressing apparatus (HIP apparatus), and over 500 apparatus are being operated. The generally used HIP apparatus has a structure in which a resistance heating type electric furnace is incorporated into a cylindrical high-pressure vessel of a press frame type. A workpiece to be processed is unloaded downward or upward by removing an upper cover or a lower cover to open the high-pressure vessel to atmosphere. In cases wherein, after processing, the workpiece is unloaded from the HIP apparatus during the time the temperature of the workpiece is somewhat high so that the workpiece is effectively processed, oxidation by air is a problem. An apparatus is thus proposed in which a workpiece to be processed is handled in a vacuum or an inert gas without being exposed to air (Japanese Patent Publication No. 63-60308).

In these HIP apparatus, in the case of small workpieces to be processed, many workpieces are processed in one batch so as to decrease the cost of HIP processing. In the case of large workpieces to be processed, e.g., workpieces having a diameter of over 10 cm and a length of 1 m, a system is employed in which a workpiece at high temperature is unloaded from a high-pressure vessel, as described above, so as to decrease the cycle time and thus decrease cost. However, even in a short cycle, a cycle time of about 1 hour is required from loading to unloading.

It is, of course, possible to apply the HIP apparatus to removal of defects in the above-described Al interconnecting film on a silicon semiconductor (wafer). However, from the viewpoint of prevention of deterioration in the formed Al interconnecting film due to oxidation, it is particularly preferable that after the sputtering step of providing the Al interconnecting film, the wafer is transferred to an apparatus under vacuum for processing in a gas atmosphere of high temperature and high pressure so that the wafer is continuously processed. The use of the above apparatus disclosed in Japanese Patent Publication No. 63-60308 permits transfer in a vacuum or an inert gas atmosphere. However, since the sputtering step basically requires a time of the order of several minutes, a lot of some silicon wafers having Al interconnecting films formed thereon must be processed. Therefore, handling becomes complicated.

It has recently been proposed that removal of pores below the Al interconnecting films formed on silicon wafers is performed for each wafer in a gas atmosphere of high temperature and high pressure in linkage with the sputtering step (Japanese Patent Laid-Open No. 7-193063). In the above publication and another publication, Japanese Patent Laid-Open No. 7-502376, applied by the same applicant, an apparatus used for processing under high pressure is proposed.

This apparatus comprises a pressure vessel comprising a plurality of casing members which are closed by pressing by another means to form a high-pressure gas processing space, a system for supplying a high-pressure gas, and means for evacuating the pressure vessel.

The opening of the high-pressure vessel through which a wafer as a workpiece to be processed is moved in and out of the vessel is provided so as to cut crosswise a substantially disk-formed high-pressure gas space. In order to seal the high-pressure gas in this space, a method is employed in which the end of a taper face is pressed by the above pressing means.

In order to perform processing with a gas at high temperature and high pressure in synchronism with a film deposition process such as a sputtering process, and transfer a plate-shaped workpiece to be processed under a vacuum before and after the processing, it is effective from the viewpoint of reduction in the transfer time that the opening for unloading and loading the workpiece is formed so as to cut crosswise the high-pressure vessel, as in the above apparatus.

However, in order to perform this processing, it is important to maintain the opening portion in an airtight state during high-pressure processing, and it is necessary to continuously, stably and safely process a large number of workpieces to be processed.

In the above-described conventional technique, an actuator which is driven by a high-pressure gas at pressure in the same level as that used for processing is used as the pressing means for maintaining the opening in an airtight state, and the pressure-receiving area of the actuator is larger than that of a processing chamber so that, in a normal state, tightening force is always generated in the opening portion. In this apparatus, the opening portion is maintained in the airtight state even if a load acting on the actuator side is decreased due to a leakage of the gas on the actuator side through a valve. However, when the gas on the actuator side leaks at a high speed, if the valve has not a sufficient opening area, the gas does not flow at a sufficient flow rate, thereby causing a pressure difference. There is thus the possibility that the opening portion is opened.

In order to seal the opening portion, a method is proposed in which the edge portion of a circular member is pressed on an opposite member to maintain airtightness. However, this method has a problem in that the selection of the circular member is difficult, and the use of a metal, which is a material having heat resistance and low out gas, causes plastic deformation of the edge portion due to tightening at each processing cycle, and work hardening which makes the edge portion impossible to resist repeated use.

SUMMARY OF THE INVENTION

Accordingly, an object of the present invention is to solve the above problems of prior art.

In order to achieve the object, the present invention provides an apparatus for processing a workpiece to be processed by heating in a high-pressure gas atmosphere in a high-pressure vessel having a heater, the apparatus comprising the following means.

In accordance with the present invention, the apparatus comprises the high-pressure vessel which is divided into at least two vessel component members in the axial direction thereof, at least one of which has cooling means; a frame for holding a load acting in the axial direction of the high-pressure vessel in processing the workpiece to be processed in the high-pressure vessel; an actuator for moving the vessel constituent member of the high-pressure vessel in the axial direction thereof to load and unload the workpiece; sealing means engaged with a portion for loading and unloading the workpiece, which is formed when one of the vessel component members is moved in the axial direction of the vessel; and retractable cotter means for transmitting a load acting on the high-pressure vessel in the axial direction thereof to the frame.

In accordance with present invention, it is preferable that the axial direction of the high-pressure vessel is the vertical direction, the frame is shaped in a window frame, and the sealing means comprises combination of a plane seal and an axial seal, and is mounted on a retainer ring.

In accordance with the present invention, the workpiece to be processed is preferably arranged on a metallic heat accumulating member having high heat conductivity and high heat capacity, and the temperature of the heat accumulating member is preferably controlled by an electric resistance heating type heater.

In accordance with the present invention, a vacuum chamber is preferably mounted on the outer surface including the opening of the high-pressure vessel so as to maintain the opening of the high-pressure vessel and the workpiece in a vacuum when the workpiece is loaded and unloaded in a vacuum atmosphere.

DESCRIPTION OF THE EMBODIMENT OF THE INVENTION

An embodiment of the present invention and the operation thereof will be described below with reference to the drawings.

Figure 1:
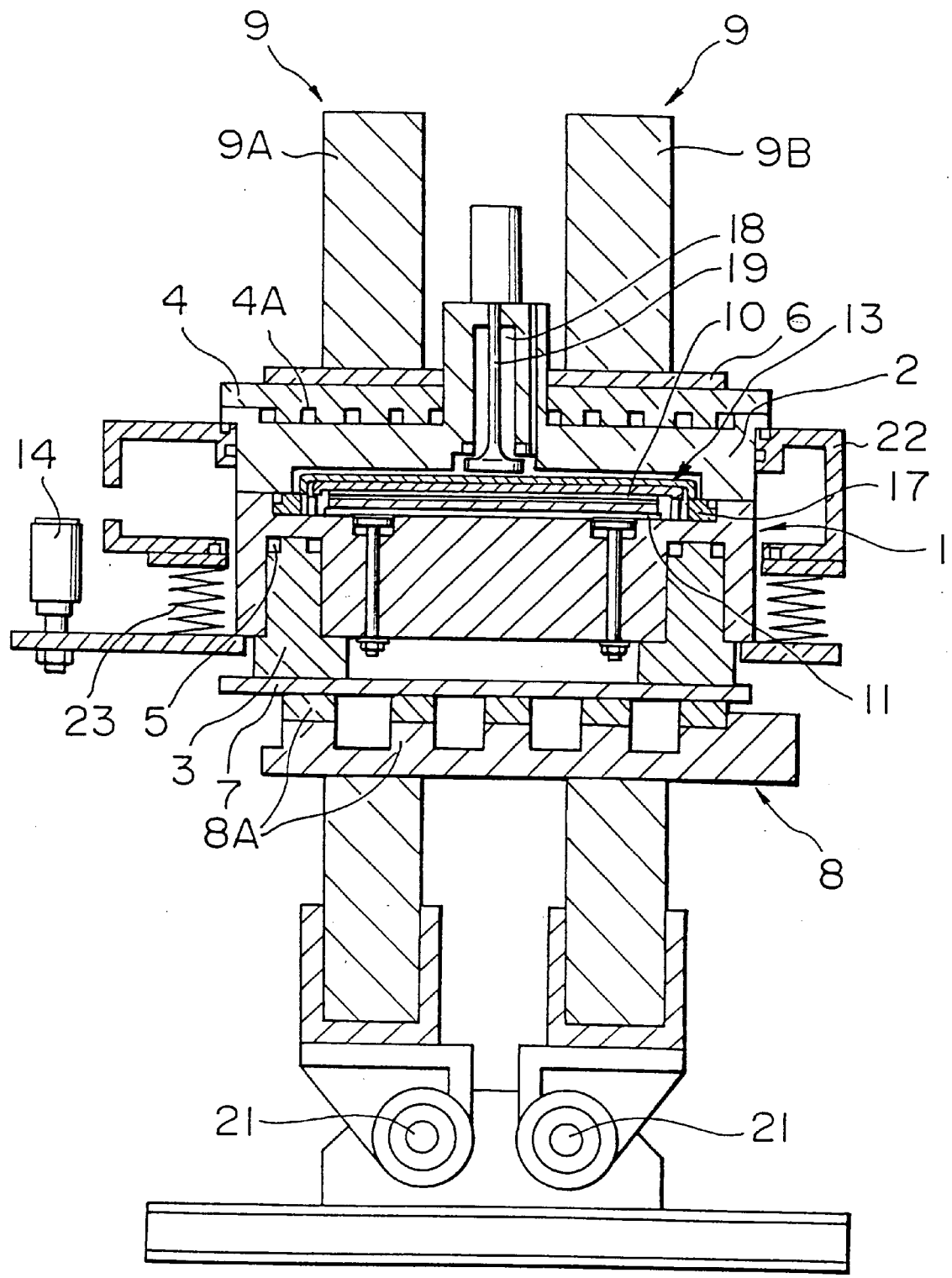
FIG. 1 is a schematic sectional view illustrating an embodiment of the present invention during processing.
Figure 3:
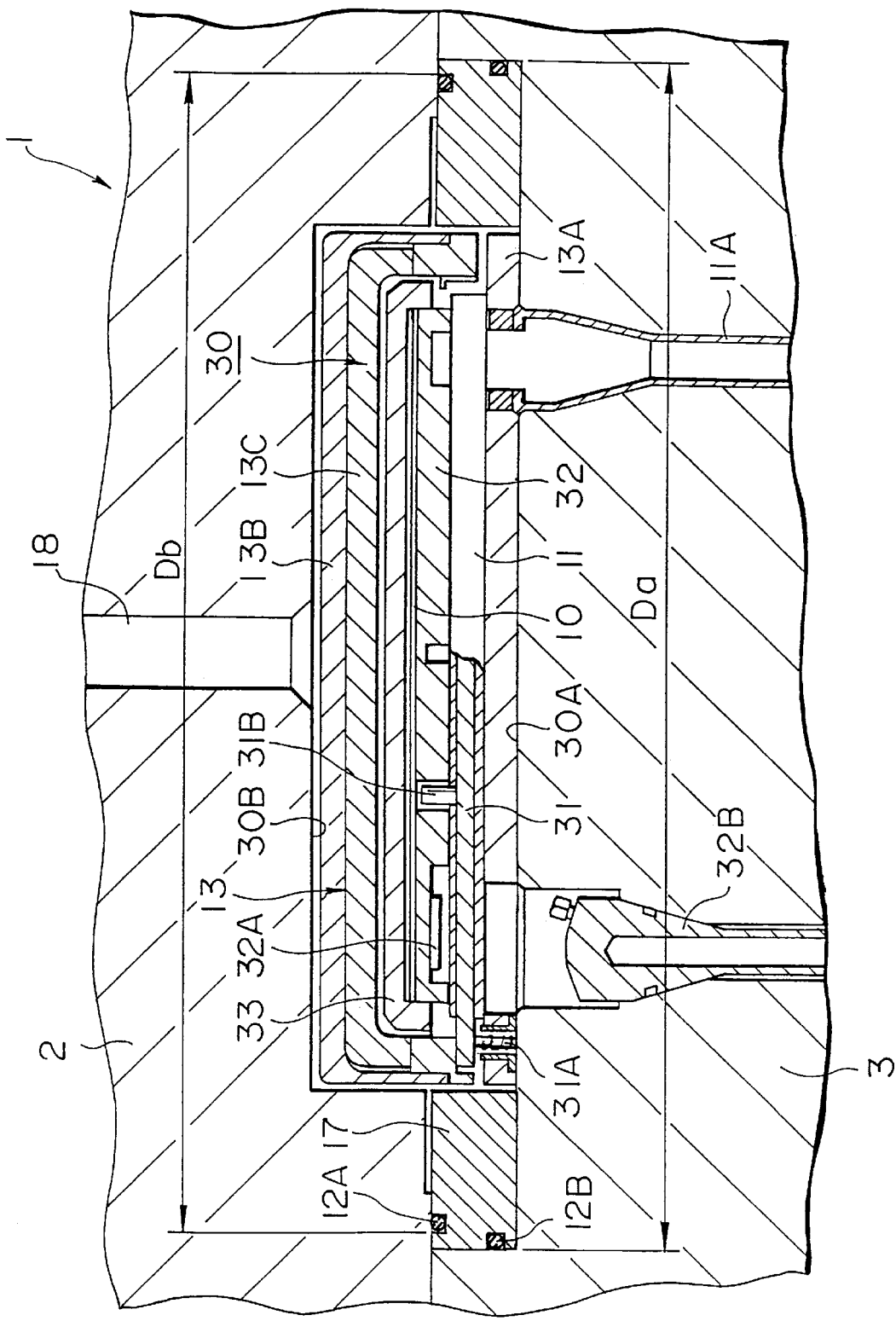
FIG. 3 is a drawing illustrating details of a heater portion of the embodiment of the present invention.

Referring to FIG. 1 schematically showing an apparatus according to the present invention, in a high-pressure vessel 1 are contained a heater 11 for heating and maintaining a silicon wafer 10 as a workpiece to be processed at a predetermined temperature, a heat insulating member 13 for suppressing heat radiation from the heater 11 to suppress overheating of the high-pressure vessel 1 and the seal members 12A and 12B shown in FIG. 3. The high-pressure vessel 1 is divided into at least two parts in the axial direction thereof. In this embodiment, the high-pressure vessel 1 comprises an upper vessel component member 2 and a lower vessel component member 3. On the upper vessel component member 2 is mounted a cooling plate 4 provided with water cooling grooves 4A. Similarly, on the lower vessel component member 3 is provided with a water passage 5 for water cooling so as to have the function to prevent overheating of the high-pressure vessel 1, particularly the seal members 12A and 12B, due to the heat generated by the heater 11. Particularly, since, in the apparatus, processing is performed in a relatively short cycle, e.g., several minutes per cycle, pressure is repeatedly increased to about 1000 kgf/cm$^2$ from pressure below atmospheric pressure and decreased each time of processing, and the apparatus is opened for loading and unloading the workpiece each time of processing, the lifetime of the seal members 12A and 12B in repeated operation is a problem. Since the seal members 12A and 12B comprise a resin material such as high-resistant fluororubber, silicon rubber or Teflon, the seal members 12A and 12B are preferably used at temperature below 200° C.

The body vessel 1 is opened and closed at the plane of division between the upper vessel component member 2 and the lower vessel component member 3. In the embodiment shown in FIG. 1, the vessel 1 is opened by moving the lower vessel component member 3 in the axial direction, i.g., downward. When the high-pressure vessel 1 is filled with a high-pressure gas such as Ar gas serving as a high pressure medium gas, the load of the high-pressure gas in the axial direction of the vessel (vertical direction) is supported by a press frame 9 cut in the form of a window frame through an upper pressure plate 6, a lower pressure plate 7 and a cotter member 8, as shown in FIG. 1. When the vessel 1 is opened, the cotter member 8 is slid sideward so that the lower vessel component member 3 can be pushed downward by a pneumatic actuator 14 together with the lower pressure plate 7 (refer to FIG. 2). The cotter member 8 shown in FIG. 1 has many projections 8A formed in the slide direction thereof so as to decrease the movement length of the cotter member 8. However, a thick plate-formed cotter member may be slid over the whole surface.

At the plane of division, sealing of the upper vessel component member 2 and the lower vessel component member 3 is achieved by a structure wherein a retainer ring 17 comprising axial and radial seal rings 12A and 12B is attached to the inner side of the upper vessel component member 2 or the lower vessel component member 3, as shown in FIG. 3. Seal 12A is radially inward of seal 12B which is located at the circumference of the retainer ring 17.

When the gas pressure in the high-pressure vessel 1 is P, a pressure difference between pressure P acting on an area corresponding to diameter Da and pressure P acting on an area corresponding to diameter Db acts on the retainer ring 17 so as to ensure the contact of the seal ring 12A having the function as a flat (radial) seal. When the high-pressure vessel 1 is actually filled with a gas at a pressure of 1000 kg/cm$^2$, extension of the press frame 9, which will be described below, and the space initially present between the cotter member 8 and the press frame 9 are eliminated, to cause a space of about 1 mm at the plane of division between the upper vessel component member 2 and the lower vessel component member 3. However, since the retainer ring 17 is moved vertically, airtightness of the plane seal portion does not deteriorate When the diameter of the silicon wafer as the workpiece to be processed is as large as 30 cm, the load generated in the axial direction of the vessel, i.e., in the vertical direction in this embodiment, the gas pressure in the high-pressure vessel 1 reaches the level of several hundreds ton, as described above. Therefore, a structure for supporting this load is very important. Particularly, in processing several tens of thousands of wafers in a short cycle of several minutes per cycle, it is indispensable to give attention to fatigue life. Although screws have been used for maintaining a load in the axial direction of the pressure vessel for a long time, a screw structure cannot avoid a problem with respect to stress concentration at the bottom of the screw thread, and an ideal state is not always created wherein the load is uniformly divided and held over the whole crew thread. Therefore, in order to prevent breakage, a large coefficient of safety must be multiplied, thereby increasing the size of the screw portion.

In such a case, as a load supporting structure in which safety is preferentially considered, it is optimum to use a press frame formed by cutting a steel plate to the shape of a window frame. The press frame used is of an integral form or is divided into some parts in the direction of thickness. In the apparatus of the present invention, the inside of the apparatus must be evacuated to a high vacuum when a wafer is unloaded and loaded, and an evacuation port 18 and a valve 19 are thus provided at the substantially central portion of the vessel. It is thus preferable to provide a space in the axial portion of the high-pressure vessel 1 and use a press frame divided into two parts, as shown in FIG. 1.

Figure 4:
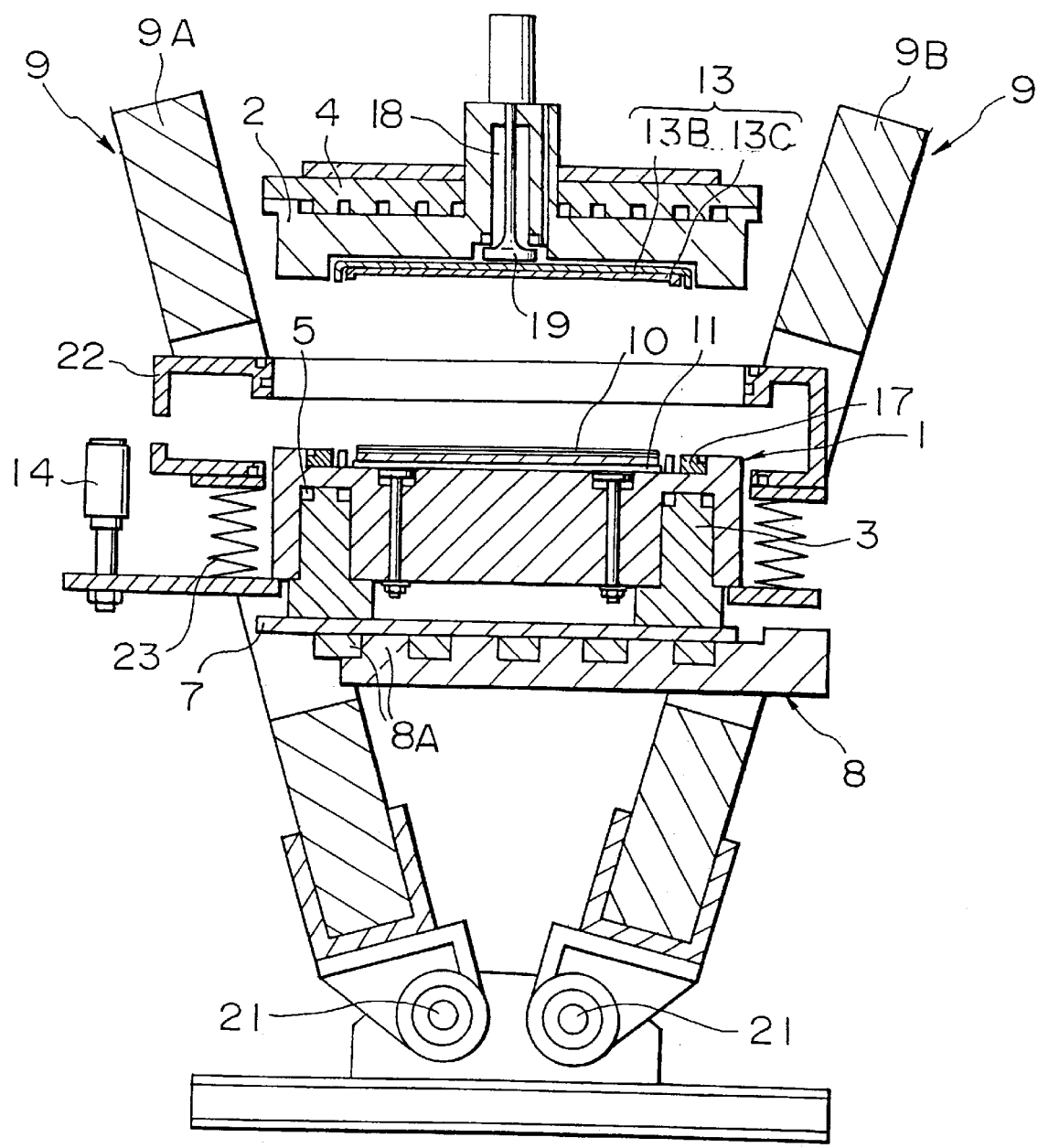
FIG. 4 is a schematic sectional view illustrating the embodiment of the present invention in a state wherein a frame is opened.

In the structure shown in FIG. 1, during normal operation, the workpiece can be loaded and unloaded by simply moving the cotter member 8 to move the lower vessel component member 3 downward, and thus the press frame 9 need not be moved. However, when the seal rings 12A and 12B mounted on the retainer ring 17 are changed to new ones, the upper vessel component member 2 must be opened upward, and thus the press frame 9 must be moved sideward. In the apparatus shown in FIG. 1, the lower ends of two press frames 9A and 9B are supported by hinges 21 so that when the upper vessel component member 2 is opened, the hinges are inclined to form a space for moving the upper vessel component member 2 upward. It is thus possible to open the vessel by moving the upper vessel component member 2 upward, as shown in FIG. 4.

The silicon wafer as the workpiece to be processed is heated and maintained at a predetermined temperature by using the heater, as described above. As the heater, a general resistance heating type heater employing Joule heat is simple and is thus recommended. However, in order to operate the apparatus in a short cycle, the high-pressure gas must be injected in a short time, i.e., at a high speed. When the high-pressure gas is injected into a closed space at a high speed, kinetic energy of the gas is changed to heat energy in a stationary state, thereby increasing the temperature of the inside. In order to prevent this effect, and prevent occurrence of a temperature distribution over the whole surface of the silicon wafer, it is recommended to heat the wafer indirectly in a state wherein it is surrounded by the heat accumulating member 32 comprising a material with excellent heat conductivity, rather than heat the workpiece directly by the heater. FIG. 3 shows an example of such an arrangement of a heater, etc. As a heater material, silicon carbide, graphite covered with silicon carbide, high-resistant metals such as molybdenum, tungsten and the like are recommended from the viewpoints of prevention of contaminations of the silicon wafer and occurrence of particles.

In FIG. 3, a heat treatment chamber 30 comprises a chamber components 30A and 30B which are formed on the mating faces of the divided vessel component members 2 and 3, respectively. On the first chamber component 30A is fitted a heat insulating plate 13A comprising quartz, alumina, or the like, on which an annular lifter with a pin 31B for pushing the wafer 10 upward, a plate-shaped heater and the heat accumulating member 32 are mounted.

Figure 2:
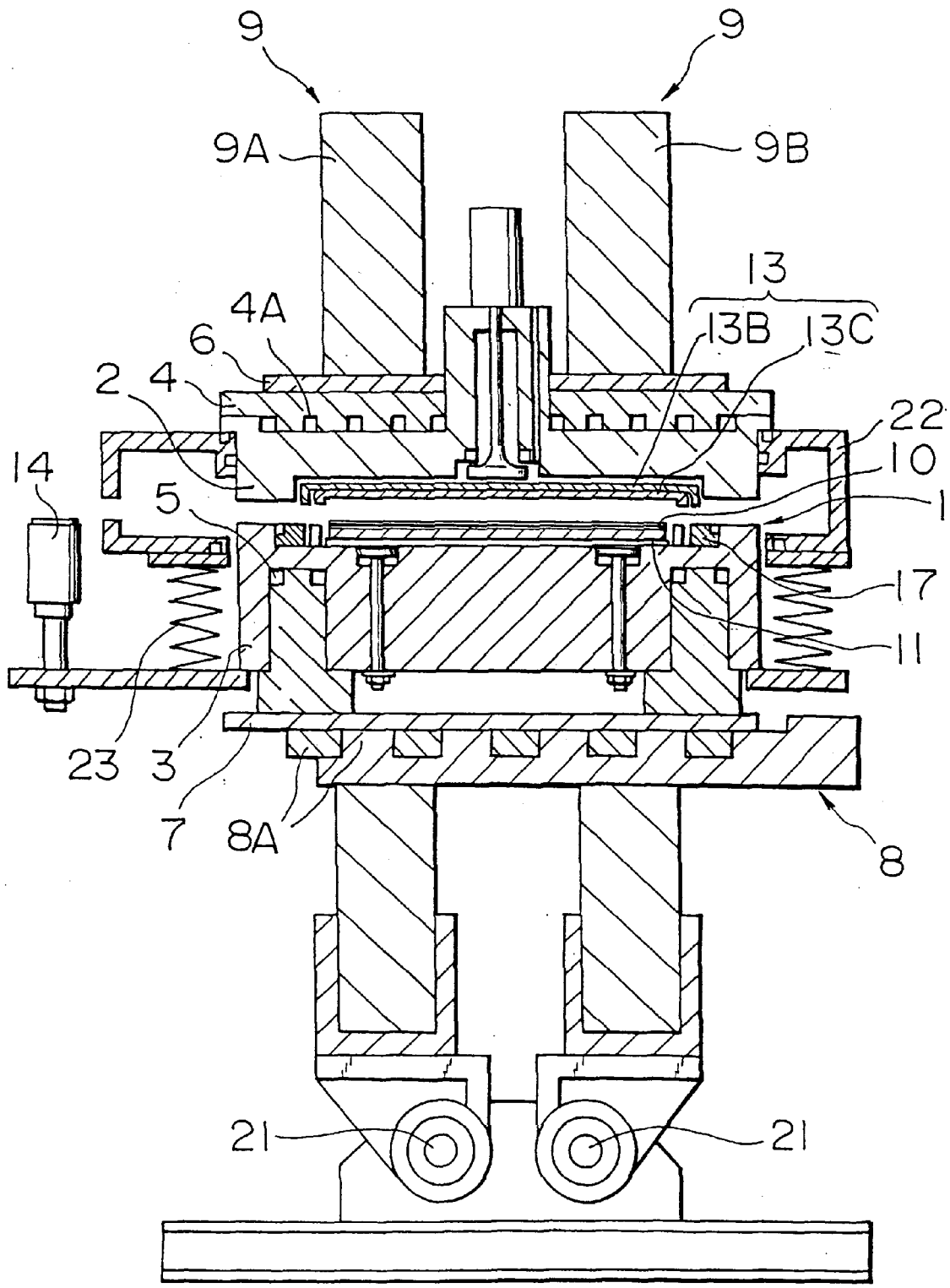
FIG. 2 is a schematic sectional view illustrating the embodiment of the present invention after processing.

The second chamber component 30B comprises the evacuation port 18 formed therein, and a clamp 33 for the workpiece 10 is mounted on the second chamber component 30B through a vertical cup-formed heat insulating cover 13B comprising SUS304, and a heat insulator 13C comprising quartz or the like. The workpiece 10 can be held between the clamp 33 and the heat accumulating member 32 during processing, and released after processing as shown in FIGS. 2 and 4.

Furthermore, in FIG. 3, the apparatus of the present invention further comprises a heater electrode plug 11A, lifter elastic means 31A, a thermocouple 32A of the heat accumulating member 32 and a thermocouple cone 32B.

As seen from the above description, since processing is performed in a short cycle, the workpiece is preferably preheated to a temperature before loaded into the apparatus, and the workpiece after processing is unloaded before the temperature is decreased to room temperature and transferred to the next step. Therefore, if the workpiece contacts air when the high-pressure vessel 1 is opened, the problem of oxidizing the workpiece occurs. In order to avoid this problem, the opening portion of the high-pressure vessel 1, i.e., the plane of division of the high-pressure vessel 1, must be maintained in a vacuum. The vacuum chamber 22 shown in FIG. 1 is provided for this purpose, and is arranged so as to cover the outside of the high-pressure vessel 1.

Even when the lower vessel component member 3 is moved downward, in order to maintain the inside in a vacuum, the lower vessel component member 3 and the vacuum chamber 22 are connected by an expansion cylindrical bellows 23.

In the vacuum chamber 22 is provided a transport port with a gate valve which can be opened and closed while maintaining a vacuum state in order to transport the workpiece processed from another vacuum vessel or the like.

In order to prevent damage of the vacuum chamber 22 when a high-pressure gas leaks from the high-pressure vessel 1 into the vacuum chamber 22 in the course of processing, the a spring-type safety valve is mounted to the vacuum chamber 22. In addition, in order to comply with a case where a large amount of high-pressure gas leaks, a structure is recommended wherein the vacuum chamber 22 and the fixed portion of the bellows (of course, including a seal member such as an O-ring) are bolted in combination with a spring. When the pressure in the vacuum chamber is increased to a value higher than that of the outside (i.e., atmospheric pressure), therefore, this bolted portion is opened to release the high-pressure gas, which leaks, into atmosphere.

In the above-described embodiment, the high-pressure vessel 1 is divided into two parts in the axial direction thereof, i.e., the vertical direction. However, the axial direction may be a horizontal direction, and the high-pressure vessel 1 may be divided into two or more parts.

Furthermore, the actuator 14 may be a hydraulic type other than the pneumatic type, or may be driven by a motor. In addition, the frame may be a truck type other than the hinge type. The retainer ring 17 may be fitted to the second chamber component 30B.

As described above, the present invention permits continuous processing in which, after an aluminum alloy interconnecting film is formed on silicon wafers one by one by the sputtering process, the wafers are processed with a high-pressure gas to remove pore defects formed below the interconnecting films through a wafer transfer chamber, and then a titanium nitride antireflection film is formed on each of the wafers by the sputtering process.

Particularly, the apparatus of the present invention can ensure reliability of sealing of the high-pressure vessel in high-pressure gas processing for continuously processing a large number of workpieces in a short cycle, and can be safely applied even to operation at the level of million times. Thus, the apparatus will significantly contribute to manufacture of semiconductor devices as an apparatus which can comply with industrial demand for manufacture of semiconductor devices without defects in fine processing of silicon wafers in future.

What is claimed is:

1. A high-temperature high-pressure gas processing apparatus for processing a workpiece to be processed by heating in a high-pressure gas atmosphere in a high-pressure vessel having a heater, comprising:

the high-pressure vessel divided into at least two vessel component members in an axial direction thereof, at least one of which has cooling means;

a frame for holding a load acting in the axial direction of the high-pressure vessel in processing the workpiece in the high-pressure vessel;

an actuator for moving the vessel component members of the high-pressure vessel in the axial direction thereof so as to loading or unloading the workpiece;

sealing means fitted to a portion for loading and unloading the workpiece, which is formed when the vessel component members are moved in the axial direction of the high-pressure vessel, said sealing means including a retainer ring forming a sealing surface and having a first axial seal at the sealing surface and a second radial seal; and a retractable cotter member for transmitting the load acting in the axial direction of the high-pressure vessel to the frame.

2. A high-temperature high-pressure gas processing apparatus according to claim 1, wherein the axial direction of the high-pressure vessel is the vertical direction, the frame is shaped in a window frame, and the sealing means comprises combination of a flat seal and an axial seal and is mounted to a retainer ring.

3. A high-temperature high-pressure gas processing apparatus according to claim 1 or 2 wherein the workpiece to be processed is arranged on a metallic heat accumulating member having high heat conductivity and high heat capacity and the temperature of the heat accumulating member is controlled by an electrical resistance heating type heater.

4. A high-temperature high-pressure gas processing apparatus according to any one of claims 1 or 2, further comprising a vacuum chamber mounted to the outside including an opening of the high-pressure vessel so as to maintain the opening and the workpiece in a vacuum when the workpiece is loaded or unloaded in a vacuum atmosphere.

5. The high-temperature high-pressure gas processing apparatus according to claim 1, wherein said second seal is located radially outward of the first seal.

6. The high-temperature high-pressure gas processing apparatus according to claim 5, wherein said second seal is located at a circumference of said retainer ring.

7. A high-temperature high-pressure gas processing apparatus according to claim 1, wherein the high-pressure vessel is divided into an upper vessel component member and a lower vessel component member and the retainer ring is placed between the upper vessel component member and the lower vessel component member.

8. A high-temperature high-pressure gas processing apparatus according to claim 7, wherein the retainer ring is in the form of a circular ring and the axial seal is placed between the top surface of the retainer ring 17 and the lower surface of the upper vessel component member, and the radial seal is placed between the outer circumference of the retainer ring and the inner circumference of the lower vessel component member.

9. A high-temperature high-pressure gas processing apparatus for processing a workpiece to be processed by heating in a high-pressure gas atmosphere in a high-pressure vessel having a heater, comprising:

the high-pressure vessel divided into at least two vessel component members in an axial direction thereof, at least one of which has cooling means;

a frame having a window for holding a load acting in the axial direction of the high-pressure vessel in processing the workpiece in the high-pressure vessel;

an actuator for moving the vessel component members of the high-pressure vessel in the axial direction thereof so as to loading or unloading the workpiece;

sealing means fitted to a portion for loading and unloading the workpiece, which is formed when the vessel component members are moved in the axial direction of the high-pressure vessel; and a retractable cotter member for transmitting the load acting in the axial direction of the high-pressure vessel to the frame.

10. The high-temperature high-pressure gas processing apparatus according to claim 9, wherein said frame comprises two frame members pivotally mounted to a stationary base.

11. A high-temperature high-pressure gas apparatus according to amended claim 10, wherein the retractable cotter member is formed with a plurality of upwardly projecting teeth and the high-pressure vessel includes an upper vessel component and a lower vessel component, and wherein the lower vessel component is provided with a plurality of downwardly projecting teeth that are in contact with the respective teeth of the retractable cotter member.

12. A high-temperature high-pressure gas apparatus according to amended claim 11, wherein the retractable cotter member is slidably movable in a direction orthogonal to the axial direction so that the cotter member is movable between a first position where the downwardly projecting teeth of the lower vessel component ride on the upwardly projecting teeth of the cotter member and a second position where the downwardly projecting teeth lie in respective spaces formed between the adjacent teeth among the upwardly projecting teeth.

13. A high-temperature high-pressure gas apparatus according to amended claim 12, wherein the frame member is pivotable between a hold position where the frame is in alignment with the axial direction and the inner surface of the frame window securely holds the high-pressure vessel in the axial direction from above and below, and a release position where the frame member is angularly displaced from the hold position so that the high-pressure vessel is not held by the frame.

14. A high-temperature high-pressure gas apparatus according to amended claim 13, wherein the frame is movable to the release position when the retractable cotter member is moved to the second position.

15. A high-temperature high-pressure gas apparatus according to amended claim 14, wherein the frame is movable to the hold position when the retractable cotter member is moved to the first position.

* * * * *